US009413517B2

(12) United States Patent
Takanashi et al.

(10) Patent No.: US 9,413,517 B2
(45) Date of Patent: Aug. 9, 2016

(54) CDR CIRCUIT AND SEMICONDUCTOR DEVICE

(71) Applicant: Synaptics Display Devices GK, Nakano-Ku, Tokyo (JP)

(72) Inventors: Mitsunori Takanashi, Tokyo (JP); Ryo Endo, Tokyo (JP)

(73) Assignee: Synaptics Display Devices GK, Tokyo (JP)

( * ) Notice: Subject to any disclaimer, the term of this patent is extended or adjusted under 35 U.S.C. 154(b) by 0 days.

(21) Appl. No.: 14/795,494

(22) Filed: Jul. 9, 2015

(65) Prior Publication Data
US 2016/0013929 A1 Jan. 14, 2016

(30) Foreign Application Priority Data

Jul. 14, 2014 (JP) .................................. 2014-144119

(51) Int. Cl.
*H03D 3/24* (2006.01)
*H04L 7/00* (2006.01)
*H03L 7/10* (2006.01)
*H03L 7/107* (2006.01)
*H04L 7/033* (2006.01)

(52) U.S. Cl.
CPC ................ *H04L 7/0004* (2013.01); *H03L 7/10* (2013.01); *H03L 7/1075* (2013.01); *H04L 7/0025* (2013.01); *H04L 7/033* (2013.01)

(58) Field of Classification Search
CPC ............. H03L 7/23; H03L 7/095; H03L 7/10; H03L 2207/50; H03L 2207/06; H03L 7/089; H03L 7/093; H03L 7/099; H03L 7/113; H03L 7/087; H03L 7/085; H03L 7/1075; H03L 7/06; H03L 7/0998; H03L 7/1972; H03L 7/22; H03L 7/1974; H03L 7/0807; H03L 7/091; H03L 7/1077; H04L 7/033; H04L 7/0025; H03C 3/0933; Y10S 331/02; G09G 5/008; H03D 13/00

USPC ................. 375/354, 371, 373, 375, 376, 355; 327/141, 155, 156, 159, 162, 163, 16, 327/146; 331/DIG. 2, 25; 332/127; 342/103; 370/395.62

IPC .............. H03L 7/08,7/089, 7/091, 7/087, 7/095

See application file for complete search history.

(56) References Cited

U.S. PATENT DOCUMENTS

| 6,753,711 | B2 * | 6/2004 | McCollum | H03L 7/089 327/156 |
| 6,803,827 | B1 * | 10/2004 | Kenney | H03L 7/107 331/1 A |
| 7,411,461 | B2 * | 8/2008 | Siddall | H03C 3/0941 327/156 |
| 7,932,784 | B1 * | 4/2011 | Janesch | H03L 7/087 331/10 |
| 2009/0108891 | A1 * | 4/2009 | Sander | H03L 7/085 327/156 |

FOREIGN PATENT DOCUMENTS

JP          2012-44446 A          3/2012

OTHER PUBLICATIONS

Tzu-Chiang et al., "A 1.7mW All Digital Phase-Locked Loop with New Gain Generator and Low Power DCO," IEEE, 2006, pp. 4867-4870.*

* cited by examiner

*Primary Examiner* — Tesfaldet Bocure
(74) *Attorney, Agent, or Firm* — Patterson + Sheridan, LLP

(57) ABSTRACT

A clock data recovery (CDR) circuit is provided with a circuit that updates a locked oscillation frequency, with a small loop gain, after phase lock based on a phase-locked loop circuit for a frequency-locked frequency is completed by a frequency-locked loop circuit or during a phase lock operation. Since the locked oscillation frequency is updated with a small loop gain, it is possible to correct a fluctuation in a frequency of an oscillation circuit in the frequency-locked loop circuit without oscillating a phase-locked loop undesirably even during a phase lock operation.

15 Claims, 10 Drawing Sheets

CDR CIRCUIT AND SEMICONDUCTOR DEVICE

CROSS-REFERENCE TO RELATED APPLICATIONS

The Present application claims priority from Japanese application JP 2014-144119 filed on Jul. 14, 2014, the content of which is hereby incorporated by reference into this application.

BACKGROUND

The present disclosure relates to a clock data recovery (CDR) circuit having a function of reproducing a clock signal from data having a clock signal embedded in a data row, and relates to, for example, a technique effective in a case of application to a data input interface circuit using a CDR circuit.

In recent years, there has been progress in the speed-up of an interface between a transmission device and a receiving device due to high definition of a display used in a smartphone or a tablet terminal. Hitherto, a source synchronous system has been widely used in which a transmission device sends out a clock together with data, and a receiving device fetches data using this clock. However, in the source synchronous system, a skew between a clock and data is obstructive to speeding up, and thus a so-called embedded clock system in which a clock is embedded in data and is transmitted has recently begun to be used.

Reception using an embedded clock system uses a CDR (Clock Data Recovery) circuit having a function of separating a clock from data, and the performance of this CDR circuit has a lot of influence on the performance of a device having the circuit incorporated therein and the entire application system thereof.

There is JP-A-2012-44446 as an example of a document in which a CDR circuit is described. In JP-A-2012-44446, a clock data recovery circuit that generates and outputs a clock signal for extracting data from a data signal transmitted in a serial manner includes a frequency-locked loop for locking the clock signal to a desired frequency using a predetermined reference clock signal, and a phase-locked loop for phase-synchronizing the clock signal with the data signal in the frequency locked state of the clock signal. Frequency comparison of a reference clock signal with the generated clock signal is performed during an operation of the frequency-locked loop, a clock signal frequency having a frequency according to the comparison result is locked, and the phase of the frequency-locked clock signal is synchronized with the phase of input data by bringing the phase-locked loop into operation.

As in JP-A-2012-44446, in the case that the reference clock is provided, and frequency lock is performed using the reference clock, the setting of an oscillation circuit is fixed after frequency lock in the case of unnecessary continuous reception for a long period of time. However, in the case of unnecessary continuous reception for a long period of time, a locked state may continue to be maintained by the reference clock even after frequency lock.

The CDR may not be provided with the reference clock. In this case, a clock signal is initially self-oscillated at the receiving device side, the adjustment of the clock signal is performed on the frequency of input data by detecting the edge of input data, and a frequency is locked. After the frequency lock is, the setting of the oscillation circuit is fixed. After the oscillation frequency is locked, a timing error of a minute phase is corrected using the phase-locked loop.

SUMMARY

Embodiments of the present disclosure provide a clock data recovery (CDR) circuit. The CDR circuit includes a frequency-locked loop circuit that synchronizes a frequency of an oscillation clock signal of an oscillation circuit with a frequency of input data. The CDR circuit further includes a phase-locked loop circuit that inputs the oscillation clock signal and outputs a phase-locked clock signal which is synchronized with a phase of the input data, and a drift correction circuit that calculates a correction value on the basis of a phase difference between the input data and the phase-locked clock signal during a phase lock operation or after phase lock completion based on the phase-locked loop circuit after frequency lock based on the frequency-locked loop circuit, and is able to correct an oscillation frequency of the oscillation circuit using the correction value, with a loop gain smaller than that of the frequency-locked loop circuit.

Embodiments of the present disclosure provide a clock data recovery (CDR) circuit. The CDR circuit includes a synchronization circuit in which a frequency-locked loop that synchronizes a frequency of an oscillation clock signal of an oscillation circuit with a frequency of input data and a phase-locked loop that inputs the oscillation clock signal and generates a phase-locked clock signal which is synchronized with a phase of the input data are formed. The synchronization circuit includes a circuit that updates a locked oscillation frequency with respect to a frequency-locked frequency based on the frequency-locked loop circuit, with a loop gain smaller than that of the frequency-locked loop, during a phase lock operation based on a phase-locked loop or after phase lock completion.

Another embodiment of the present disclosure provides a semiconductor device comprising. The semiconductor device includes an external interface circuit, and a processing circuit that processes data which is supplied to the external interface circuit. The external interface circuit includes a clock data recovery (CDR) circuit that inputs the data, wherein the CDR circuit includes a frequency-locked loop circuit that synchronizes a frequency of an oscillation clock signal of an oscillation circuit with a frequency of input data and a phase-locked loop circuit that inputs the oscillation clock signal and outputs a phase-locked clock signal which is synchronized with a phase of the input data. The CDR circuit further includes a drift correction circuit that calculates a correction value on the basis of a phase difference between the input data and the phase-locked clock signal during a phase lock operation or after phase lock completion based on the phase-locked loop circuit after frequency lock based on the frequency-locked loop circuit, and is able to correct an oscillation frequency of the oscillation circuit using the correction value, with a loop gain smaller than that of the frequency-locked loop circuit.

Another embodiment of the present disclosure provide a clock data recovery (CDR) circuit includes a synchronization circuit in which a frequency-locked loop that synchronizes a frequency of an oscillation clock signal of an oscillation circuit with a frequency of input data and a phase-locked loop that inputs the oscillation clock signal and generates a phase-locked clock signal which is synchronized with a phase of the input data are formed. The synchronization circuit includes a circuit that updates a locked oscillation frequency with respect to a frequency-locked frequency based on the frequency-locked loop circuit, with a loop gain smaller than that of the frequency-locked loop, during a phase lock operation based on a phase-locked loop or after phase lock completion.

DETAILED DESCRIPTION

Introduction

Figure 1:
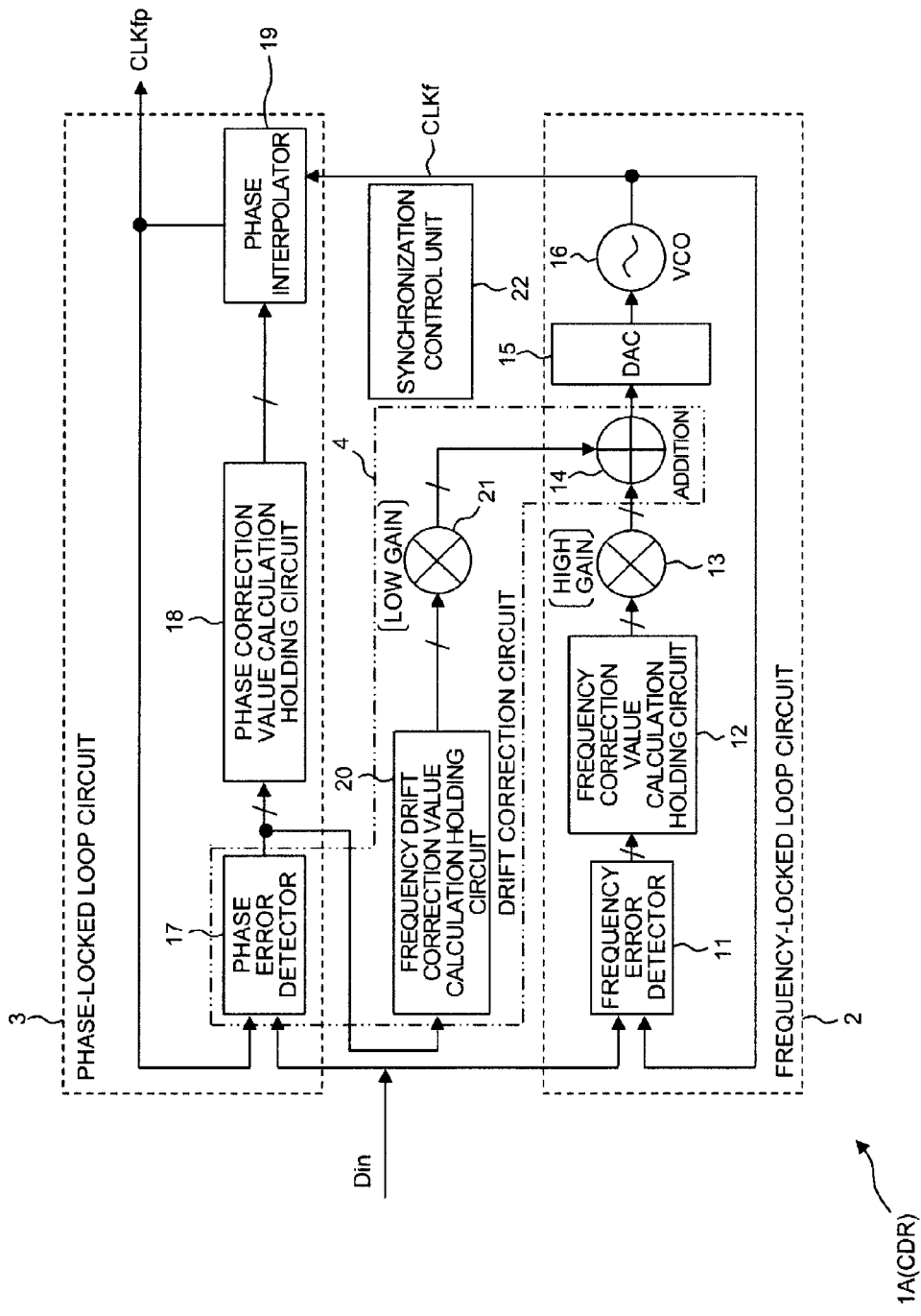
FIG. 1 is a block diagram illustrating a CDR circuit according to a first embodiment.

In the CDR circuit, in cases where a clock signal is reproduced from transmission data, and data is received in the clock signal, data reception for a short period of time has no problem in a method of performing data reception by performing frequency lock without using a reference clock. However, it can be understood that, in cases where continuous reception for a long period of time is performed, there is a possibility that the oscillation frequency of an oscillation circuit fluctuates due to a change in temperature or a fluctuation in power supply voltage and frequency lock is released, that is, a possibility that concern for the clock signal not being able to be synchronized with received data in phase correction is caused and the received data is not able to be reproduced.

In such a case, data transmission is temporarily stopped by outputting a re-request for frequency lock to the transmission device, and frequency lock is resumed in the meantime. However, in the case that data transmission is temporarily stopped in order to resume a frequency lock operation, data transmission efficiency drops.

Embodiments of the present disclosure make it possible to synchronize an oscillation clock signal with respect to input data without resuming a frequency lock operation using an input data pattern, even an undesired frequency fluctuation is caused to occur in an oscillation circuit of a CDR circuit due to a change in temperature or the like.

The following is a brief description of the summary of the representative embodiments of the invention disclosed in the present application.

That is, a CDR circuit is provided with a circuit that updates a locked oscillation frequency, with a small loop gain (with a reduction in loop bandwidth), after phase lock based on a phase-locked loop circuit for a frequency-locked frequency is completed by a frequency-locked loop circuit or during a phase lock operation. Since the locked oscillation frequency is updated with a small loop gain, it is possible to correct a fluctuation in a frequency of an oscillation circuit in the frequency-locked loop circuit without oscillating a phase-locked loop undesirably even during a phase lock operation.

The following is a brief description of an effect obtained by the representative embodiments of the invention disclosed in the present application.

That is, it is possible to synchronize an oscillation clock signal with respect to input data without resuming a frequency lock operation using an input data pattern, even in the case that an undesired frequency fluctuation is caused to occur in an oscillation circuit due to a change in temperature or the like.

1. Summary of the Embodiments

First, summary of representative embodiments of the invention disclosed in the application will be described. Reference numerals in drawings in parentheses referred to in description of the summary of the representative embodiments just denote components included in the concept of the components to which the reference numerals are designated.

(1) Drift Correction for Correcting Frequency Fluctuation of Oscillation Circuit after Frequency Lock A CDR circuit (1) includes a frequency-locked loop circuit (2) that synchronizes a frequency of an oscillation clock signal (CLKf) of an oscillation circuit (16) with a frequency of input data (Din), a phase-locked loop circuit (3) that inputs the oscillation clock signal and outputs a phase-locked clock signal (CLKfp) which is synchronized with a phase of the input data, and a drift correction circuit (4) that calculates a correction value on the basis of a phase difference between the input data and the phase-locked clock signal during a phase lock operation or after phase lock completion based on the phase-locked loop circuit after frequency lock based on the frequency-locked loop circuit, and is able to correct an oscillation frequency of the oscillation circuit using the correction value, with a loop gain smaller than that of the frequency-locked loop circuit.

According to this, a locked oscillation frequency is corrected by the drift correction circuit having a loop gain smaller than that of the frequency-locked loop circuit. In other words, the small loop gain is equivalent to a reduction in loop bandwidth, and thus it is possible to slow down a response of negative feedback control with respect to a fluctuation in the frequency of the oscillation circuit. Therefore, it is possible to correct a fluctuation in the frequency of the oscillation circuit in the frequency-locked loop circuit without oscillating a phase-locked loop undesirably even during the phase lock operation. Even in cases where an undesired frequency fluctuation is caused to occur in the oscillation circuit due to a change in temperature or the like, it is possible to synchronize an oscillation clock signal with respect to input data without resuming the frequency lock operation using an input data pattern.

(2) Drop of Loop Gain and Addition of Correction Value Based on Phase Error to Frequency Control Data In item 1, the drift correction circuit calculates a frequency correction value on the basis of a phase error detected in the phase-locked loop circuit, and adds the correction value to frequency control data of the frequency-locked loop circuit, with a loop gain smaller than that of the frequency-locked loop circuit.

According to this, it is possible to easily reflect a correction value in the frequency-locked loop circuit.

(3) Formation of Fixed Pattern for Frequency-Locked Target

In item 2, the frequency-locked loop circuit performs a frequency lock operation on a specific fixed pattern of input data. The phase-locked loop circuit performs phase lock on an arbitrary pattern of input data.

According to this, it is possible to contribute to simplification of the frequency-locked loop circuit and low power consumption. On the assumption of this, the drift correction circuit can calculate a correction value with respect to an arbitrary pattern after frequency lock completion by diverting a phase error detection function for phase lock corresponding to an arbitrary pattern after frequency lock completion.

(4) Control of Frequency Fluctuation Correction

In item 2, the CDR circuit further includes a control unit (22), taking charging of control, which instructs the phase-locked loop circuit to start a phase lock operation in response to a frequency lock completion notification in the frequency-locked loop circuit, instructs the drift correction circuit to calculate the frequency correction value in response to a phase lock completion notification, adds the correction value to frequency control data of the frequency-locked loop circuit, with a loop gain smaller than that of the frequency-locked loop circuit, in cases that the calculated correction value reaches a predetermined value, and instructs the phase-locked loop circuit to start a phase lock operation again.

According to this, since a locked oscillation frequency is corrected in a phase lock completion state using the drift correction circuit having a loop gain smaller than that of the frequency-locked loop circuit, it is possible to correct a fluctuation in oscillation frequency by previously preventing the occurrence of concern for the phase-locked loop becoming unstable.

(5) Gain Drop of Frequency-Locked Loop after Frequency Lock

A CDR circuit (1A) includes a frequency-locked loop circuit (2A) that synchronizes a frequency of an oscillation clock signal (CLKf) of an oscillation circuit (16) with a frequency of input data (Din), and a phase-locked loop circuit (3) that inputs the oscillation clock signal and outputs a phase-locked clock signal (CLKfp) which is synchronized with a phase of the input data. The frequency-locked loop circuit performs a frequency lock operation in a state where a loop gain is switched to be small, concurrently with a phase lock operation of the phase-locked loop circuit after frequency lock or after completion of the phase lock operation.

According to this, since the frequency lock operation is performed in a state where the loop gain of the locked frequency-locked loop circuit is switched to a small loop gain, it is possible to correct a fluctuation of the frequency of the oscillation circuit in the frequency-locked loop circuit without oscillating a phase-locked loop undesirably even during the phase lock operation. It is possible to synchronize an oscillation clock signal with respect to input data without resuming a frequency lock operation using an input data pattern, even in cases that an undesired frequency fluctuation is caused to occur in an oscillation circuit due to a change in temperature or the like.

(6) Variable Gain Circuit

In item 5, the frequency-locked loop circuit includes a variable gain circuit (13A) capable of variably switching a loop gain.

According to this, it is possible to simply perform switching of the loop gain of the frequency-locked loop circuit.

(7) Setting of Arbitrary Pattern to Frequency-Locked Target

In item 5, the frequency-locked loop circuit performs a frequency lock operation on an arbitrary pattern of input data. The phase-locked loop circuit performs phase synchronization on an arbitrary pattern of input data.

According to this, the configuration of the frequency-locked loop circuit becomes more complicated than in cases that the frequency lock operation is performed using a specific fixed pattern, but it is possible to cope with the correction of the oscillation frequency by switching the loop gain of the frequency-locked loop circuit without requiring the creation of a new loop circuit such as the drift correction circuit.

(8) Control of Frequency Fluctuation Correction

In item 6, the CDR circuit further includes a control unit (22A), performing control, which instructs the phase-locked loop circuit to start a phase lock operation in response to a frequency lock completion notification in the frequency-locked loop circuit, instructs the frequency-locked loop circuit to start a frequency lock operation by switching a loop gain to be small in response to a phase lock completion notification, and instructs the phase-locked loop circuit to start a phase lock operation again after frequency lock completion.

According to this, since a locked oscillation frequency of the oscillation circuit is corrected in a phase lock completion state using the frequency-locked loop circuit switched to a small loop gain, it is possible to correct a fluctuation in oscillation frequency by previously preventing the occurrence of concern for the phase-locked loop becoming unstable.

(9) Application of Semiconductor Device to Interface Circuit

A semiconductor device (106) includes an external interface circuit (101, 102, 102A) and a processing circuit (104) that processes data which is supplied to the external interface circuit, and the external interface circuit includes the CDR circuit (1, 1A) according to item 1 as a circuit that inputs the data.

According to this, it is possible to contribute to an improvement in the reliability of a so-called clock embedded data interface in the semiconductor device.

(10) Display Driving Device

In item 9, the processing circuit inputs image data which is supplied to the CDR circuit, and outputs a gradation voltage corresponding to the input image data in pixel units in synchronization with a display timing.

According to this, in a display port or the like which is the standard of a video output interface, even in cases that an oscillation frequency fluctuates due to a change in temperature or a fluctuation in power supply voltage, it is possible to prevent an input data fetching error from being generated due to the frequency fluctuation.

(11) Correction of Frequency Fluctuation of Oscillation Circuit after Frequency Lock A CDR circuit includes a synchronization circuit (2, 3, 4, 2A) in which a frequency-locked loop that synchronizes a frequency of an oscillation clock signal (CLKf) of an oscillation circuit (16) with a frequency of input data (Din) and a phase-locked loop that inputs the oscillation clock signal and generates a phase-locked clock signal (CLKfp) which is synchronized with a phase of the input data are formed. The synchronization circuit includes a circuit (20, 21, 14, 13A) that updates a locked oscillation frequency with respect to a frequency-locked frequency based on the frequency-locked loop, with a loop gain smaller than that of the frequency-locked loop, during a phase lock operation based on a phase-locked loop or after phase lock completion.

According to this, since a locked oscillation frequency is updated with a loop gain smaller than that of the frequency-locked loop, it is possible to correct a fluctuation in the frequency of the oscillation circuit in the frequency-locked loop without oscillating the phase-locked loop undesirably even during the phase lock operation. It is possible to synchronize an oscillation clock signal with respect to input data without resuming a frequency lock operation using an input data pattern, even in cases that an undesired frequency fluctuation is caused to occur in an oscillation circuit due to a change in temperature or the like.

(12) Frequency-Locked Loop for Correction

In item 11, the update circuit is a drift correction circuit (4) that calculates a correction value on the basis of a phase difference between the input data and the phase-locked clock signal during a phase lock operation or after phase lock completion based on the phase-locked loop after frequency lock of the frequency-locked loop, and is able to correct a fluctuation in an oscillation frequency of the oscillation circuit using the correction value, with a loop gain smaller than that of the frequency-locked loop.

According to this, even in cases that simplification of the frequency-locked loop and low power consumption are schemed by the frequency-locked loop performing a frequency lock operation on a specific fixed pattern of input data, in drift correction, a correction value can be calculated with respect to an arbitrary pattern after frequency lock completion.

(13) Control of Frequency Fluctuation Correction

In item 12, the CDR circuit further includes a control unit (22), taking charging of control, which instructs the phase-locked loop to start a phase lock operation in response to a frequency lock completion notification in the frequency-locked loop, instructs the drift correction circuit to calculate the correction value in response to a phase lock completion notification, adds the correction value to frequency control data of the frequency-locked loop, with a loop gain smaller than that of the frequency-locked loop, in cases that the calculated correction value reaches a predetermined value, and instructs the phase-locked loop to start a phase lock operation again.

According to this, since a locked oscillation frequency is corrected in a phase lock completion state, using the drift correction circuit having a loop gain smaller than that of the frequency-locked loop, it is possible to correct a fluctuation in oscillation frequency by previously preventing the occurrence of concern for the phase-locked loop becoming unstable.

(14) Drop in Gain of Frequency-Locked Loop after Frequency Lock

In item 11, the update circuit is a variable gain circuit (13A), disposed in the frequency-locked loop circuit, which is capable of variably switching a loop gain. The variable gain circuit switches a loop gain to be small concurrently with a phase lock operation of the phase-locked loop after frequency lock or after completion of the phase lock operation.

According to this, in cases that the frequency-locked loop circuit can perform frequency lock on an arbitrary pattern of input data, it is possible to cope with the correction of the oscillation frequency by switching the loop gain of the frequency-locked loop without creating a new loop circuit such as the drift correction circuit.

(15) Control of Frequency Fluctuation Correction

In item 14, the CDR circuit further includes a control unit (22A), performing control, which instructs the phase-locked loop to start a phase lock operation in response to a frequency lock completion notification in the frequency-locked loop, instructs the frequency-locked loop to start a frequency lock operation by switching a loop gain to be small in response to a phase lock completion notification, and instructs the phase-locked loop to start a phase lock operation again after frequency lock completion.

According to this, since a locked oscillation frequency of the oscillation circuit is corrected in a phase lock completion state using the frequency-locked loop switched to a small loop gain, it is possible to correct a fluctuation in oscillation frequency by previously preventing the occurrence of concern for the phase-locked loop becoming unstable.

2. Further Detailed Description of the Embodiments

A further detailed description of the embodiments will be given below.

First Embodiment

An example of a CDR circuit 1 using a drift correction circuit will be described as a first embodiment.

A CDR circuit according to the first embodiment is illustrated in FIG. 1. The CDR circuit 1 shown in the drawing includes a frequency-locked loop circuit 2, a phase-locked loop circuit 3, a drift correction circuit 4 and a synchronization control unit 22.

The frequency-locked loop circuit 2 synchronizes the frequency of an oscillation clock signal CLKf of an oscillation circuit (VCO) 16 with the frequency of input data Din. For example, the frequency-locked loop circuit includes a frequency error detector 11, a frequency correction value calculation holding circuit 12, a gain circuit 13, an adder 14, a DA converter (DAC) 15 that converts a digital signal into an analog signal, and an oscillation circuit 16 constituted by a voltage controlled oscillator (VCO) which are specifically illustrated, and is configured such that the clock signal CLKf which is oscillated in the oscillation circuit 16 is fed back to the frequency error detector 11, to thereby form a negative feedback loop as a whole. A known circuit may be adopted as each of the circuits. For example, the frequency error detector 11 can count each edge change of the input data Din of a fixed pattern such as the repetition of 1 and 0 and the oscillation clock signal CLKf using counters for each predetermined timing, and detect a frequency error on the basis of a difference between both count values. The frequency correction value calculation holding circuit 12 has a digital filter function of integrating the frequency error to cut a short-period signal component of the integrated value, a data latch function of holding a signal code generated by the digital filter function, and the like.

The data held in the frequency correction value calculation holding circuit 12 is provided with a necessary loop gain by the gain circuit 13, and is converted into an analog voltage signal by the DAC 15 through the adder 14. The frequency correction value calculation holding circuit 12 and the gain circuit 13 can be integrally formed of a digital filter.

The VCO 16 includes a varicap, and outputs the clock signal CLKf at an oscillation frequency according to a change in capacitance which is generated by an analog voltage signal applied to the varicap. Considering a frequency lock operation (operation for causing the frequency of the clock signal CLKf to be coincident with the frequency of the input data Din) of the clock signal CLKf based on the frequency-locked loop circuit 2, a relatively large (high) loop gain required for obtaining necessary negative feedback responsiveness is set in the gain circuit 13. The high loop gain is equivalent to an increase of a loop bandwidth, and can improve responsiveness to a fluctuation in the oscillation frequency of the VCO 16.

The phase-locked loop circuit 3 inputs the oscillation clock signal CLKf and generates a clock signal CLKfp (phase-locked clock signal CLKfp) which is synchronized with the phase of the input data Din. For example, the phase-locked loop circuit includes a phase error detector 17, a phase correction value calculation holding circuit 18, and a phase interpolator 19 which are specifically illustrated, and is configured such that the clock signal CLKfp which is corrected in the phase interpolator 19 is fed back to the phase error detector 17, to thereby form a negative feedback loop as a whole. A known circuit may be adopted as each of the circuits. For example, the phase error detector 17 can be constituted by a so-called digital phase comparator that outputs a voltage (phase difference voltage) according to a phase difference. The phase correction value calculation holding circuit 18 has a digital filter function of integrating the phase difference voltage to cut a short-period signal component of the integrated value, a data latch function of holding a signal code generated by the digital filter function, and the like.

The phase interpolator 19 adjusts phase lead/lag of the clock signal CLKf in accordance with the signal code which is held in the phase correction value calculation holding circuit 18 to output the clock signal CLKfp, and performs phase lock for optimizing the phase of the clock signal CLKfp in synchronization with a timing of the edge of the input data Din.

The drift correction circuit 4 is used to calculate a correction value on the basis of the phase difference between the input data Din and the clock signal CLKfp during a phase lock operation or after phase lock completion based on the phase-locked loop circuit 3 after frequency lock based on the frequency-locked loop circuit 2, and to be able to correct the oscillation frequency of the oscillation circuit 16 using the correction value, with a loop gain smaller than that of the frequency-locked loop circuit 2. For example, the drift correction circuit is constituted by a frequency drift correction value calculation holding circuit 20, a gain circuit 21 having a gain lower than that of the gain circuit 13, and the adder 14 which are specifically illustrated. The frequency drift correction value calculation holding circuit 20 has a digital filter function of cutting a short-period signal component for an integrated value obtained by integrating the phase difference voltage from the phase error detector 17, a data latch function of determining whether the integrated value generated by the digital filter function exceeds a predetermined threshold, and holding code data of the integrated value in cases of the exceeding, and the like.

The code data held in the frequency drift correction value calculation holding circuit 20 is provided with a relatively low loop gain by the gain circuit 21, and this loop gain is supplied to the adder 14. In this case, a signal code for obtaining the frequency of the frequency-locked clock signal CLKf is supplied to the adder 14 through the gain circuit 13, and an output of the gain circuit 21 that reduces a loop gain is added to an output of the gain circuit 13 that increases a loop gain. Thereby, the frequency of the clock signal CLKf is changed depending on the output of the gain circuit 13. Meanwhile, the frequency drift correction value calculation holding circuit 20 and the low gain circuit 21 can be integrally formed of a digital filter.

A change based on the drift correction circuit 4 with respect to the frequency of the clock signal CLKf aims at compensating for the fluctuation portion of the clock signal CLK due to a change in temperature, and the magnitude of the code data which is output by the frequency drift correction value calculation holding circuit 20 and the loop gain which is provided by the gain circuit 21 are determined so as to be commensurate with the object. In short, the output of the low gain circuit 21 causes responsiveness to the frequency fluctuation of the VCO 16 to be slowed down.

Figure 5:
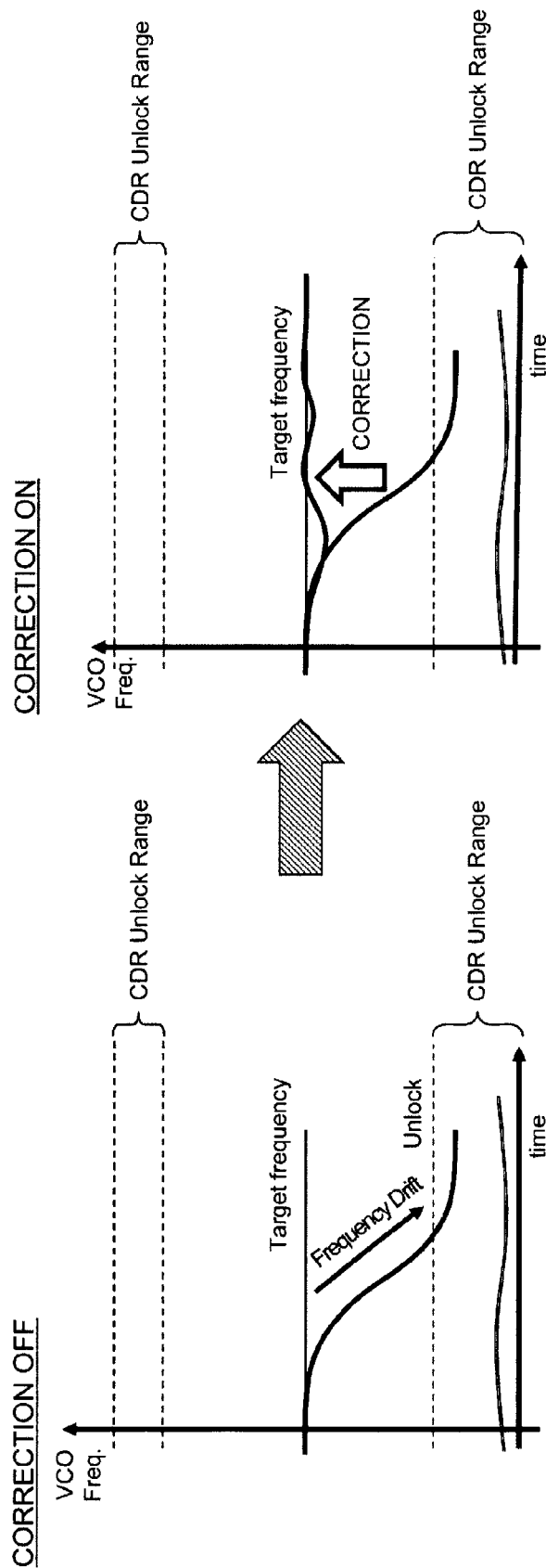
FIG. 5 is a diagram illustrating a case where frequency correction is performed in the case that a frequency drift of an oscillation clock signal of a voltage controlled oscillator (VCO) is left as it is.

For example, in the case that the continuous operating time of the CDR circuit lengthens, the output frequency of the VCO 16 drifts due to a change in temperature. While the amount of drift is small, the clock signal CLKfp can be corrected by phase correction based on the phase-locked loop circuit 3, but the clock signal is not able to be corrected in cases where the amount becomes larger, and frequency lock is released after a while. As illustrated in FIG. 5, in the case that the frequency of the VCO 16 is assumed to presently drop in association with a change in temperature, the oscillation frequency of the VCO 16 drops as it is in the case of not performing the correction, and frequency lock is released at a certain point in time. In cases where the oscillation frequency of the VCO 16 drops to any arbitrary value, the drift correction circuit 4 corrects data to be supplied to the DAC 15 so as not to be equal to or less than the value. Thereby, lock of the frequency of the clock signal CLKf which is temporarily locked is not released.

Figure 2:
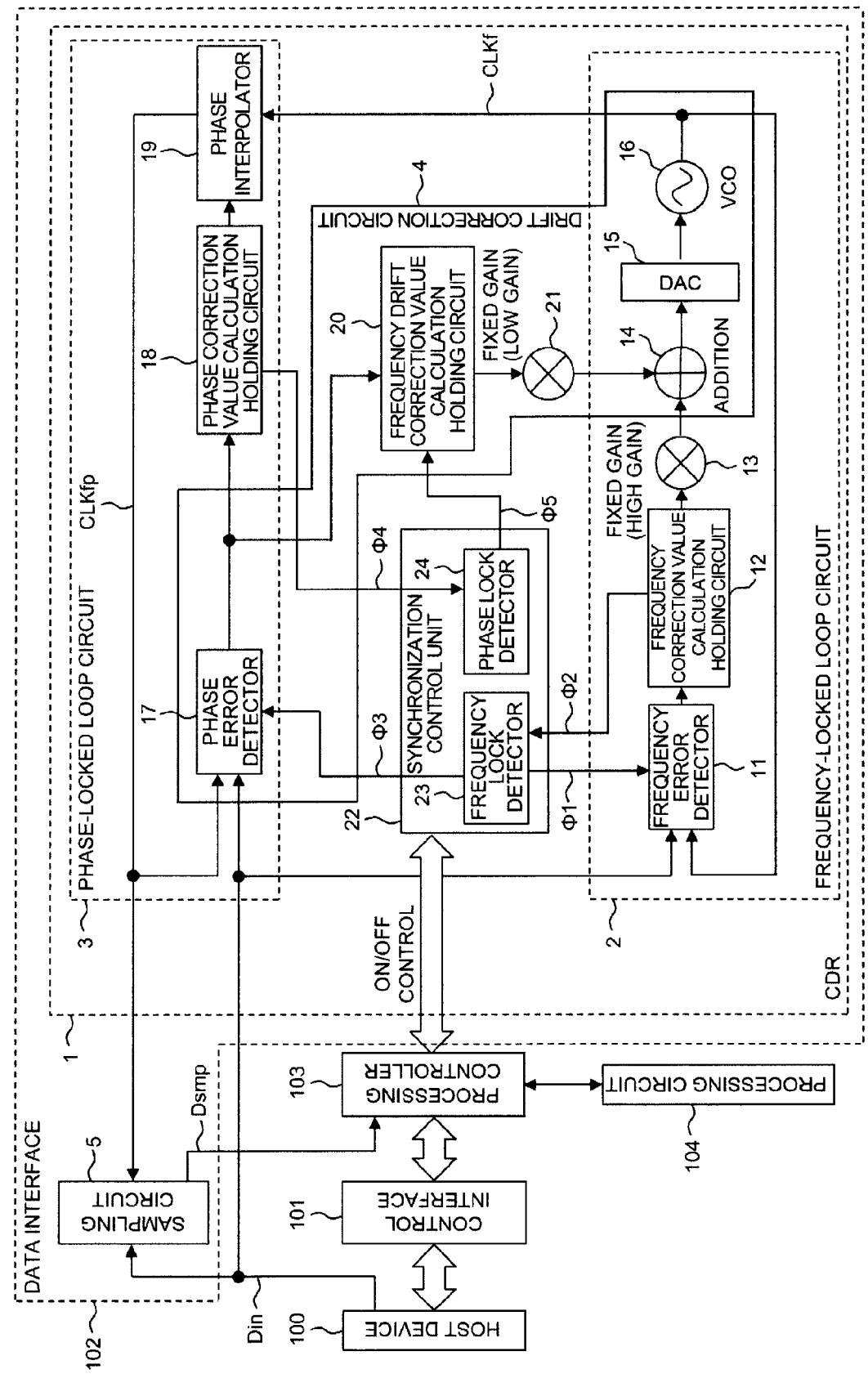
FIG. 2 is a block diagram illustrating a system configuration in the case that the CDR circuit of FIG. 1 is applied to a data interface.

FIG. 2 illustrates a system configuration in the case that the CDR circuit 1 of FIG. 1 is applied to a data interface, and particularly illustrates a specific example of the synchronization control unit 22 in the CDR circuit 1.

The system illustrated in FIG. 2 is configured such that a host device 100 is connected to a device which is constituted by a control interface 101, a data interface 102, a processing controller 103 and a processing circuit 104, the control interface 101 inputs a command issued by the host device 100, the data interface 102 inputs data which is output by the host device 100, the processing controller 103 decodes the command, and that the processing controller 103 causes the processing circuit 104 to process the input data in accordance with the decoded result.

The data interface 102 is constituted as a so-called clock embedded interface by the CDR circuit 1 and the sampling circuit 5. The sampling circuit 5 fetches the input data Din in synchronization with the clock signal CLKfp generated in the CDR circuit 1, and provides the fetched data to the processing controller 103.

The synchronization control unit 22 controls operations of frequency lock based on a frequency lock detector 23, phase lock based on a phase lock detector 24, and frequency correction based on the drift correction circuit 4. In addition, φ1 is an operation instruction signal of the frequency error detector 11, φ2 is a completion notice signal of frequency lock, φ3 is an instruction signal of a detection operation for the phase error detector 17, φ4 is a completion notice signal of phase lock, and φ5 is an instruction signal of an operation for the frequency drift correction value calculation holding circuit 20.

The synchronization control unit 22 controls operations of frequency lock based on the frequency lock detector 23, phase lock based on the phase lock detector 24, and frequency correction based on the drift correction circuit 4.

Figure 3:
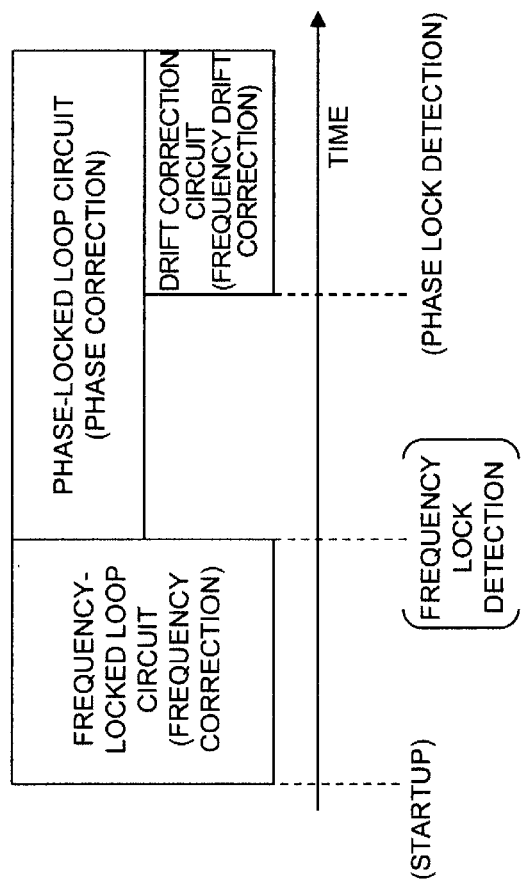
FIG. 3 is a timing diagram illustrating a basic control form for the CDR circuit based on a synchronization control unit of FIG. 1.

FIG. 3 illustrates a basic control form for the CDR circuit 1 based on the synchronization control unit 22. Initially, a frequency correction operation based on the frequency lock detector 23, that is, a frequency lock operation of the clock signal CLKf is started. The input data Din used in this operation is limited to a specific data pattern in which 1 and 0 are repeated in the present embodiment. Thereby, in the case that frequency lock is detected, this time, a phase correction operation based on the phase lock detector 24, that is, a phase lock operation is started. In an initial phase lock operation, the input data Din of a specific pattern may also be used similarly to the frequency lock operation, and a separate training pattern may be used. After phase lock based on the phase correction operation is detected, a frequency drift correction based on the drift correction circuit 4 is started. The frequency correction of the clock signal CLKf based on the drift correction circuit 4 may be performed concurrently with the phase correction operation after phase lock, and may be performed in a state where the phase correction operation is stopped after phase lock.

Figure 4:
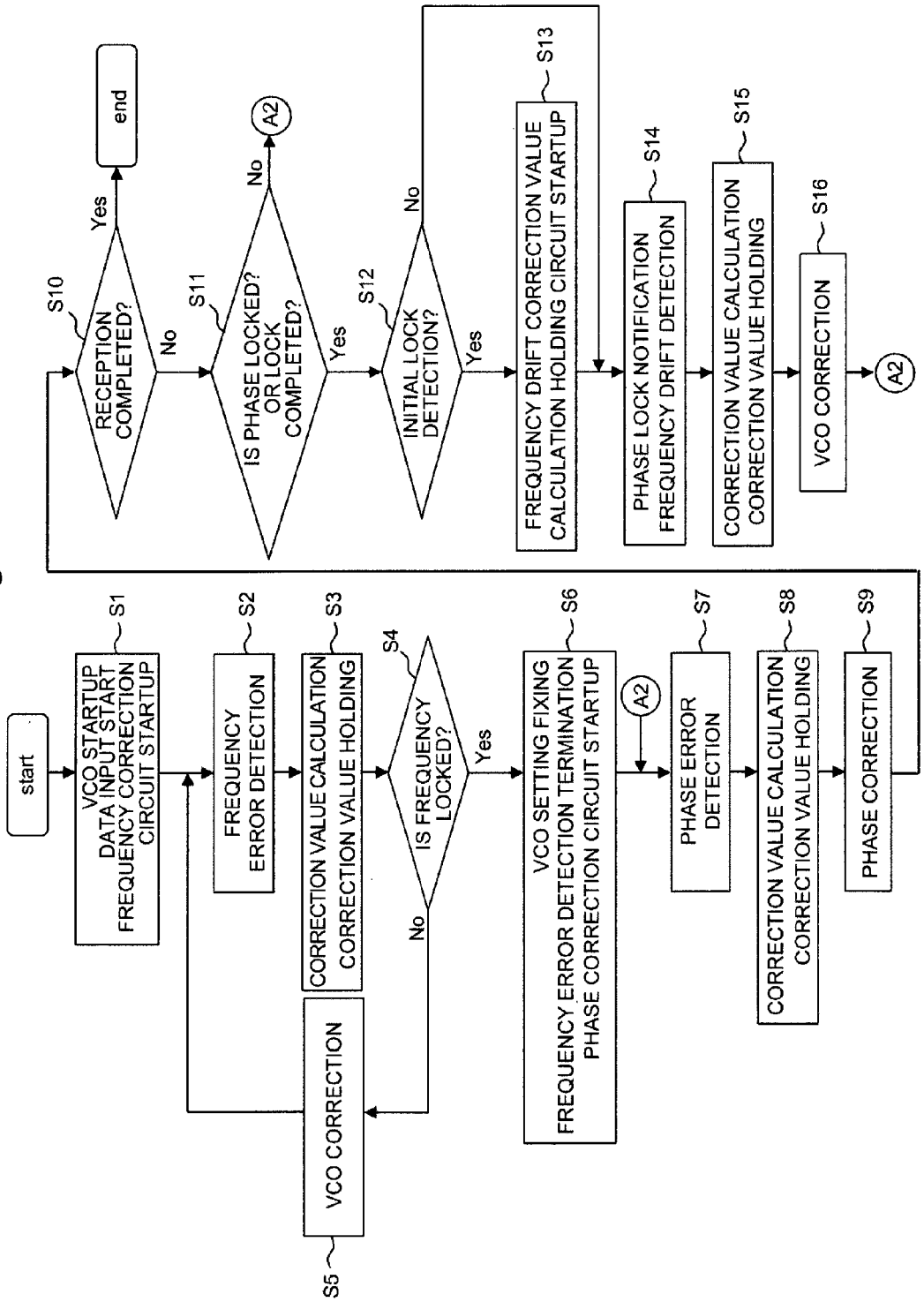
FIG. 4 is a flow diagram illustrating an operation flow of the CDR circuit of FIG. 1.

FIG. 4 illustrates an operation flow of the CDR circuit 1. First, the processing controller 103 gives an instruction for activation (ON) to the CDR circuit 1 in accordance with a command from the host device 100, the synchronization control unit 22 starts up the VCO 16, makes the frequency-locked loop circuit 2 operable by bringing the frequency error detector 11 into operation using the signal $\phi 1$, or the like, and starts an input of the data Din (S1). Thereby, an error between the input data Din and the frequency of the oscillation clock signal CLKf of the VCO 16 is detected by the frequency error detector 11 (S2), the frequency correction value calculation holding circuit 12 calculates and holds a correction value on the basis of the detected error (S3), it is determined whether the oscillation frequency CLKf is locked (S4), and the correction value is reflected in the VCO 16 in the case that the oscillation frequency is not locked (S5). The processes of S2 to S5 are repeated until frequency lock is determined. In the case that frequency lock of the clock signal CLKf is determined, the setting of the VCO 16 is fixed, frequency error detection based on the frequency-locked loop circuit 2 is terminated by the signal $\phi 2$, the phase-locked loop circuit 3 is started up this time (S6), and phase error detection based on the phase error detector 17 is started by the signal $\phi 3$ (S7). Thereby, a correction value is calculated in the phase correction value calculation holding circuit 18 on the basis of a phase difference between the input data Din and the clock signal CLKfp, and the calculated correction value is held (S8). The phase of the input clock signal CLKf is corrected by the held correction value, and the corrected phase is reflected in the clock signal CLKfp (S9).

Thereafter, it is determined whether the reception of all the input data Din is completed (S10), otherwise, it is determined whether the phase of the clock signal CLKfp is coincident with the phase of the input data Din and the phase is locked, or phase lock has been already completed (S11), otherwise, the process returns to step S7, and the processes of steps S7 to S11 are repeated until phase lock is completed. Meanwhile, at least, at a predetermined timing at which the prediction time to the completion of frequency lock has elapsed, the input data Din is changed to original communication data from a specific fixed pattern for frequency lock.

In cases where phase lock is completed by the phase-locked loop circuit 3, the completion is notified of the synchronization control unit 22 by the signal $\phi 4$. In the case that the notification is a first phase lock notification (S12), the synchronization control unit 22 starts up the frequency drift correction value calculation holding circuit 20 using the signal $\phi 5$ (S13), inputs an output of the phase error detector 17 (S14), calculates a correction value for correcting the frequency drift of the oscillation circuit 16 on the basis of the accumulation of a phase difference in the case that a phase fluctuation exceeds a threshold, and holds the calculated correction value (S15). The oscillation frequency of the oscillation circuit 16 is corrected by the held correction value (S16).

After the frequency of the clock signal CLKf is corrected, the phase-locked loop circuit 3 and the drift circuit 4 are simultaneously brought into operation, and the processes S7 to S11 of performing phase correction and the processes S14 to S16 of correcting an oscillation frequency are performed concurrently. In the case that the frequency drift correction circuit 4 is once started up, a startup state is maintained as it is, and the circuit operates concurrently with the phase-locked loop circuit after the startup as shown in FIG. 3. That is, the flow diagram is shown as if to perform the drift correction and the phase correction in a serial manner in order to simplify illustration, but in practice, the drift correction circuit operates even during the phase correction after the drift correction is performed. Since the drift correction circuit 4 has a slow response, the phase correction converges sufficiently and then a drift correction value is changed again. The processes S7 to S11 for the phase correction and the correction processes S14 to S16 of the oscillation frequency of the VCO 16 for the frequency drift based on the drift correction circuit 4 are repeated until reception completion.

According to the first embodiment, the following operational effects are exhibited.

(1) After phase lock is completed, the oscillation frequency of the VCO 16 is corrected by the drift correction circuit 4 having a loop gain smaller than that of the frequency-locked loop circuit 2, and thus the frequency fluctuation of the oscillation circuit in the frequency-locked loop circuit can be corrected without oscillating a phase-locked loop undesirably even during the phase lock operation. Even in the case that an undesired frequency fluctuation is caused to occur in the oscillation circuit VCO 16 due to a change in temperature or the like, the oscillation clock signal CLKf can be synchronized with respect to the input data Din without resuming the frequency lock operation using a specific pattern of the input data Din.

(2) The drift correction circuit 4 calculates a frequency correction value on the basis of a phase error detected in the phase-locked loop circuit 3, and adds the correction value to frequency control data of the frequency-locked loop circuit 2 using the adder 14 with a loop gain smaller than that of the frequency-locked loop circuit 2, thereby allowing the correction value to be easily reflected in the frequency-locked loop circuit 2.

(3) It goes without saying that the phase-locked loop circuit 3 has to perform phase lock on an arbitrary pattern of input data, but regarding frequency lock which is performed in the preceding stage, frequency lock is not necessarily performed on the arbitrary pattern simultaneously therewith. In this point, the frequency detector 11 in the first embodiment sets a specific fixed pattern such as the repetition of 1 and 0 to a frequency-locked target, and thus the simplification of the frequency-locked loop circuit 2 and low power consumption can be schemed. On the assumption of this, the drift correction circuit 4 can calculate the frequency drift by diverting an error detection function of the phase error detector 17 corresponding to the arbitrary pattern after the completion of frequency lock.

(4) As described in the flow diagram of FIG. 4, in the first embodiment, an oscillation frequency in which frequency lock is completed is corrected in a phase lock completion state, using the drift correction circuit 4 having a loop gain smaller than that of the frequency-locked loop circuit 2, and thus the fluctuation of an oscillation frequency can be corrected by previously preventing the occurrence of concern for a phase-locked loop becoming unstable by the phase-locked loop circuit 3 performing excess negative feedback control through the frequency correction based on the drift correction circuit 4.

Second Embodiment

An example of a CDR circuit using a drift correction circuit will be described as a second embodiment.

Figure 6:
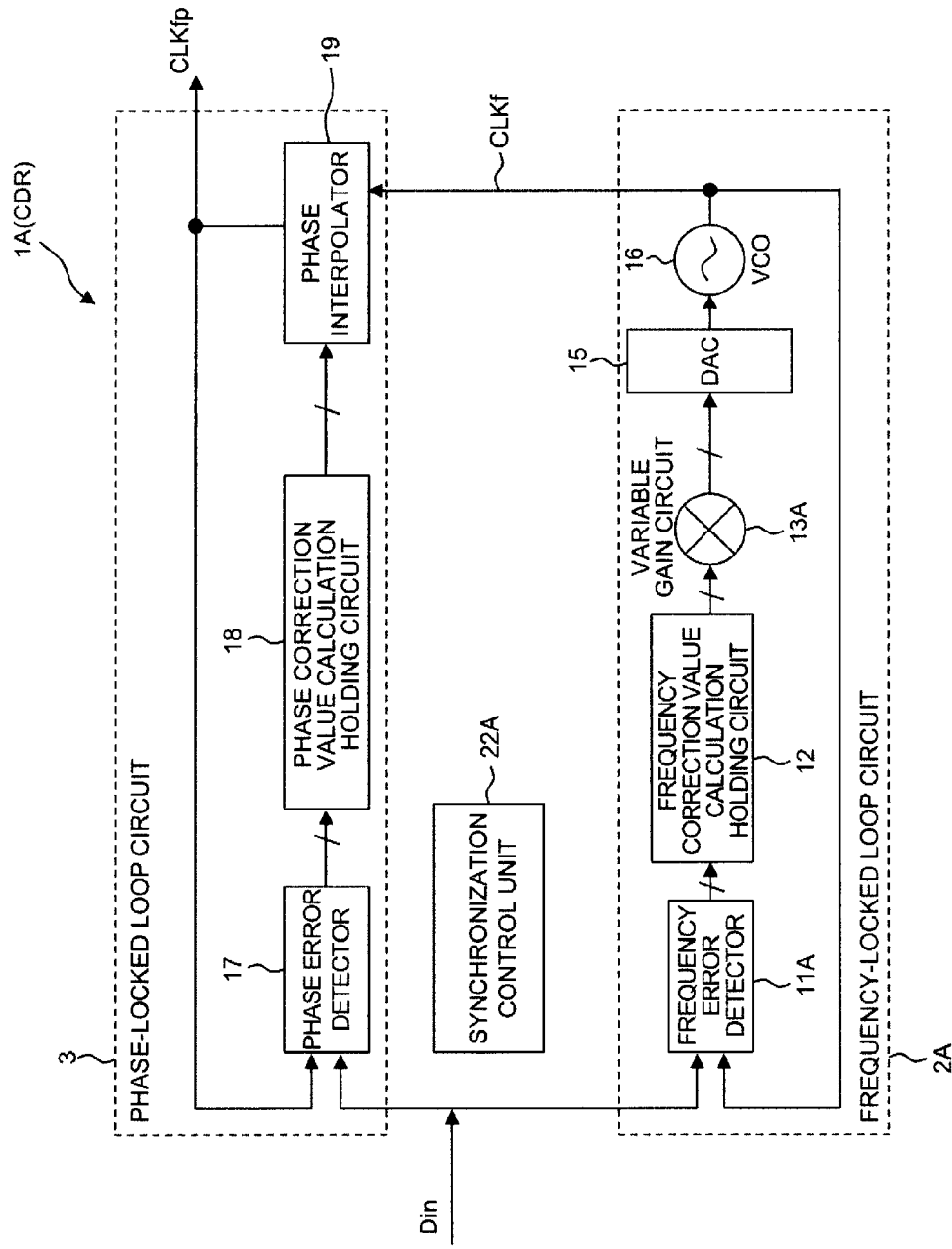
FIG. 6 is a block diagram illustrating a CDR circuit according to a second embodiment.

FIG. 6 illustrates a CDR circuit 1A according to the second embodiment. The CDR circuit 1A shown in the drawing includes a frequency-locked loop circuit 2A and a phase-locked loop circuit 3. The drift correction circuit 4 is not used which extends between the phase-locked loop circuit 3 and the frequency-locked loop circuit 2 as adopted in the first embodiment of FIG. 1. In the second embodiment, the loop gain of the frequency-locked loop circuit 2A is made variable, and thus frequency correction for the frequency drift of the VCO 16 is performed in the frequency-locked loop circuit 2A.

A specific example of the CDR circuit 1A according to the second embodiment will be described. A difference from FIG. 1 lies in a configuration of the frequency-locked loop circuit 2A adopted instead of the drift correction circuit 4. That is, a frequency detector 11A can detect a frequency error with respect to not only a specific fixed pattern such as the repetition of 1 and 0 but also an arbitrary pattern, and has a circuit scale larger than the frequency error detector 11. This is because the frequency detector complies with application in which frequency lock has to be performed on various input patterns. A specific circuit configuration is not shown in the drawing, but a known circuit configuration using a counter or the like may be adopted. Besides, in the frequency-locked loop circuit 2A, since a variable gain circuit 13A capable of variably switching a loop gain for a correction value held in the frequency correction value calculation holding circuit 12 is adopted instead of the fixed gain circuit 3, and the drift correction circuit 4 is not used, the adder 14 is not in use. In the frequency-locked loop circuit 2A, a high loop gain is set in the variable gain circuit 13A in a frequency lock operation immediately after startup, and an error based on the frequency error detector 11A can be reflected in the oscillation frequency of the VCO 16 with relatively high responsiveness. After frequency lock followed by the completion of phase lock, a low loop gain is set in the variable gain circuit 13A, and an error based on the frequency error detector 11A can be reflected on the oscillation frequency of the VCO 16 with relatively low responsiveness. The capability of correction of a frequency in a direction making up for the oscillation frequency fluctuation (frequency drop) of the VCO 16 due to a change in temperature may be sufficient, and reversely, a sensitive response to a slight fluctuation causes the release of phase synchronization, which results in the frequency of the clock signal CLKfp becoming unstable. Such circumstances are the same as those in the first embodiment. A synchronization control unit 20A performs switching control of a loop gain in the frequency-locked loop circuit according to a synchronous operation of an oscillation clock, and control of the frequency-locked loop circuit and control of the phase-locked loop circuit 3 similarly to the above. Meanwhile, circuit blocks realizing the same functions as those in FIG. 1 are denoted by the same reference numerals and signs, and thus the description thereof will not be given.

Figure 7:
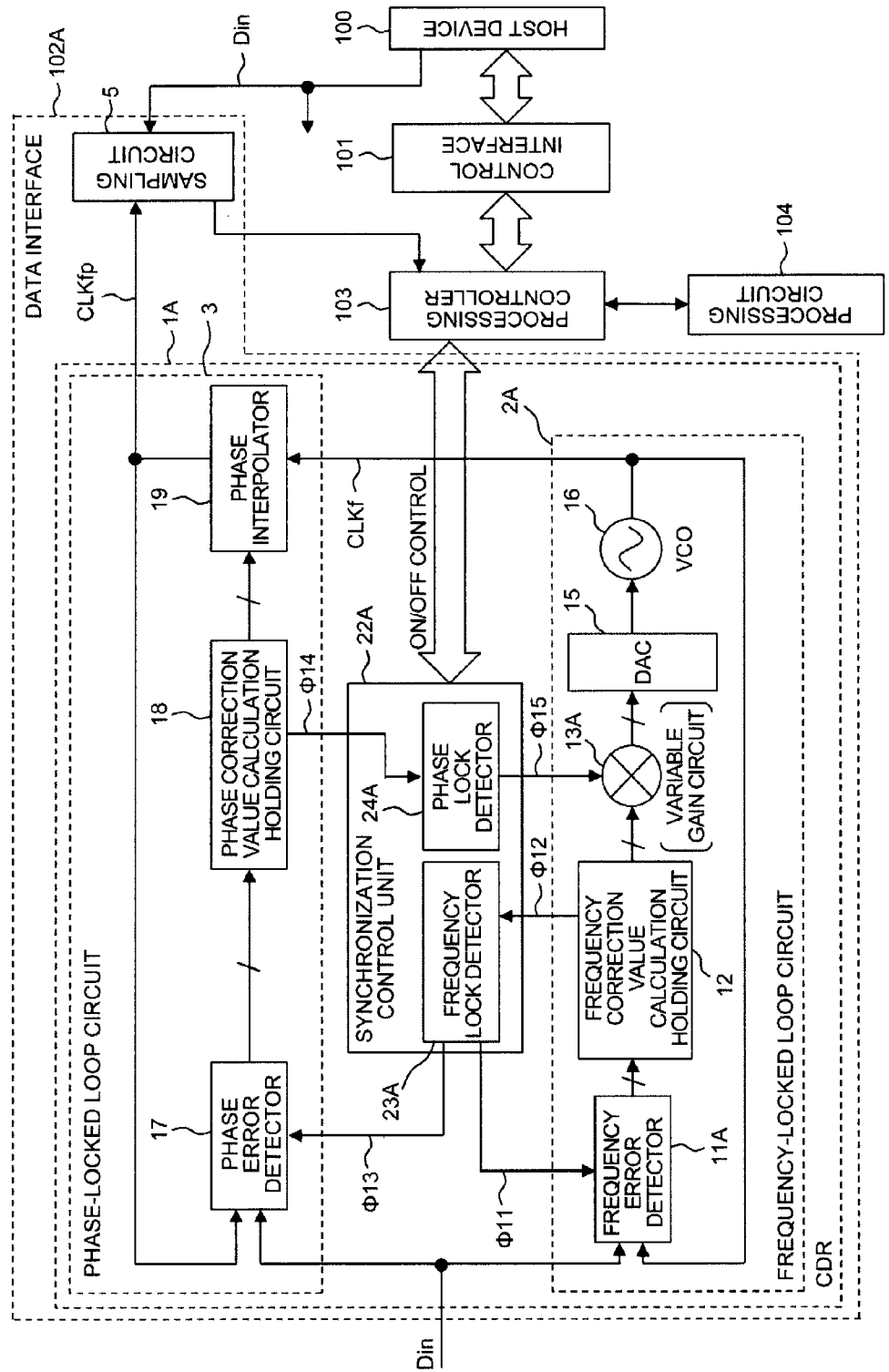
FIG. 7 is a block diagram illustrating a system configuration in the case that the CDR circuit of FIG. 6 is applied to a data interface.

FIG. 7 illustrates a system configuration in cases that the CDR circuit 1A of FIG. 6 is applied to a data interface. The system illustrated in FIG. 7 is configured such that the host device 100 is connected to a device which is constituted by a control interface 101, a data interface 102A, a processing controller 103 and a processing circuit 104, the control interface 101 inputs a command issued by the host device 100, the data interface 102A inputs data which is output by the host device 100, the processing controller 103 decodes the command, and that the processing controller 103 causes the processing circuit 104 to process the input data in accordance with the decoded result.

The data interface 102A is constituted as a so-called clock embedded interface by the CDR circuit 1A and the sampling circuit 5. The sampling circuit 5 fetches the input data Din in synchronization with the clock signal CLKfp generated in the CDR circuit 1A, and provides the fetched data to the processing controller 103.

A synchronization control unit 22A in the CDR circuit 1A includes a frequency lock detector 23A and a phase lock detector 24A. The synchronization control unit 22A controls frequency lock based on the frequency lock detector 23A, phase lock based on the phase lock detector 24 and switching of a loop gain. In addition, $\phi 11$ is an operation instruction signal of the frequency error detector 11A, $\phi 12$ is a completion notice signal of frequency lock, $\phi 13$ is an instruction signal of a detection operation for the phase error detector 17, $\phi 14$ is a completion notice signal of phase lock, and $\phi 15$ is a switching signal of a loop gain for the variable gain circuit 13A. Circuit blocks having the same functions as those in FIG. 2 are denoted by the same reference numerals and signs, and thus the description thereof will not be given.

Figure 8:
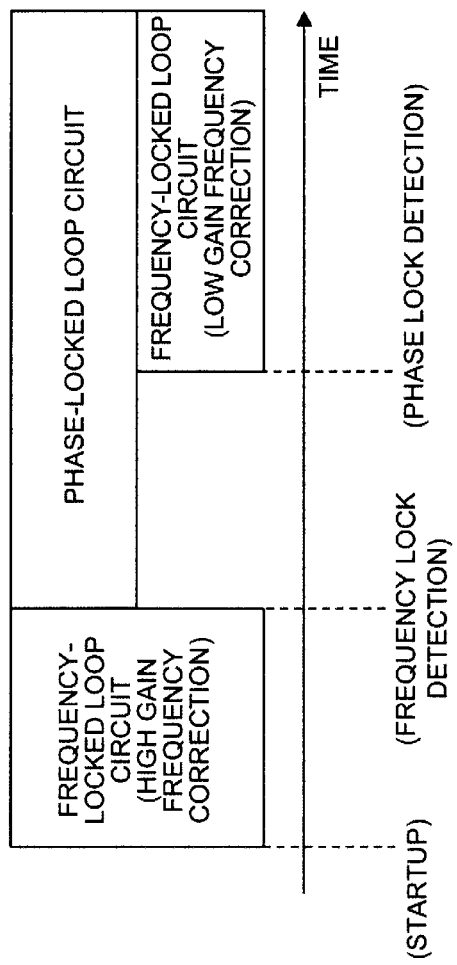
FIG. 8 is a timing diagram illustrating a basic control form for the CDR circuit based on a synchronization control unit of FIG. 6.

FIG. 8 illustrates a basic control form for the CDR circuit 1A based on the synchronization control unit 22A. Initially, a frequency correction operation based on the frequency lock detector 23A, that is, a frequency lock operation of the clock signal CLKf is started. The input data Din used in this operation is different in that in the first embodiment and has an arbitrary data pattern. Thereby, in cases that frequency lock is detected, this time, a phase correction operation based on the phase lock detector 24A, that is, a phase lock operation is started. A phase lock operation is also performed on the input data Din having an arbitrary pattern similarly to the frequency lock operation. Incases that phase lock is detected by the phase correction operation, the phase lock detector 24A switches a loop gain of the variable gain circuit 13A to be low, and the frequency-locked loop circuit 2A corrects a fluctuation in the oscillation clock signal of the VCO 16 with a low loop gain. The drift correction of the VCO 16 based on the frequency-locked loop circuit 2A in this low loop gain is performed after initial phase lock, and after the initial phase lock, drift correction is performed concurrently with the phase correction operation of the phase-locked loop circuit 3. Alternatively, the frequency-locked loop circuit 2A may be simultaneously started up during the startup of the phase-locked loop circuit 3.

Figure 9:
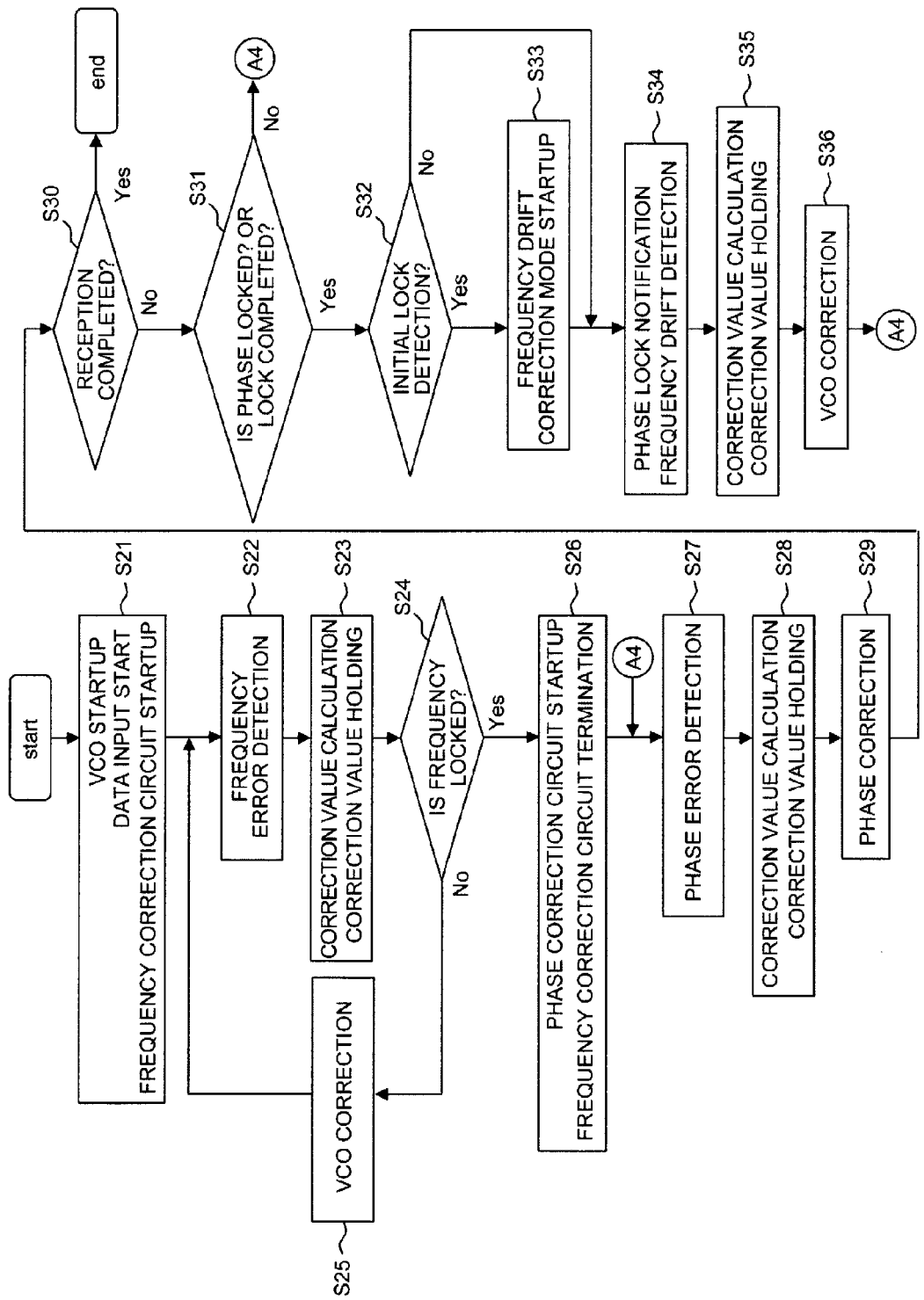
FIG. 9 is a flow diagram illustrating an operation flow of the CDR circuit of FIG. 6.

FIG. 9 illustrates an operation flow of the CDR circuit 1A. First, the processing controller 103 gives an instruction for activation (ON) to the CDR circuit 1A in accordance with a command from the host device 100, the synchronization control unit 22A starts up the VCO 16, makes the frequency-locked loop circuit 2A operable by bringing the frequency error detector 11A into operation using the signal $\phi 1$, or the like, and starts an input of the data Din (S21). Thereby, an error between the input data Din and the frequency of the oscillation clock signal CLKf of the VCO 16 is detected by the frequency error detector 11A (S22), the frequency correction value calculation holding circuit 12 calculates and holds a correction value on the basis of the detected error (S23), it is determined whether the oscillation frequency CLKf is locked (S24), and the correction value is reflected in the VCO 16 in cases that the oscillation frequency is not locked (S25). The processes of S22 to S25 are repeated until frequency lock is determined. In cases that frequency lock of the clock signal CLKf is determined, the setting of the VCO 16 is fixed, frequency error detection based on the frequency-locked loop circuit 2A is terminated by the signal φ2, the phase-locked loop circuit 3 is started up this time (S26), and phase error detection based on the phase error detector 17 is started by the signal φ3 (S27), a correction value is calculated in the phase correction value calculation holding circuit 18 on the basis of a phase difference between the input data Din and the clock signal CLKfp, and the calculated correction value is held (S28). The phase of the clock signal CLKf is corrected by the held correction value, and the corrected phase is reflected in the clock signal CLKfp (S29).

Thereafter, it is determined whether the reception of all the input data Din is completed (S30), otherwise, it is determined whether the phase of the clock signal CLKfp is coincident with the phase of the input data Din and the phase is locked, or phase lock has been already completed (S31), otherwise, the process returns to step S27, and the processes of steps S27 to S31 are repeated until phase lock is completed. Reception completion determination is performed by the processing controller 103.

In the case that phase lock is completed by the phase-locked loop circuit 3, the completion is notified of the synchronization control unit 22A by the signal φ4. In the case that the notification is a first phase lock notification (S32), the synchronization control unit 22A causes the frequency-locked loop circuit 2A to start up a frequency drift correction mode using the signal φ15 (S33). That is, the loop gain of the variable gain circuit 13A is switched from a high gain to a low gain by the signal φ15 and the frequency-locked loop circuit 2A is brought into operation. Thereby, the frequency correction value calculation holding circuit 12 inputs a frequency error detected in the frequency error detector 11A (S34), and the frequency correction value calculation holding circuit 12 calculates a correction value for correcting the frequency drift of the oscillation circuit 16 on the basis of the input error, to hold the calculated correction value (S35). The oscillation frequency of the oscillation circuit 16 is corrected to a low loop gain by the held correction value (S36).

After the frequency of the clock signal CLKf is corrected, the processes S27 to S31 for phase correction are performed again using the phase-locked loop circuit 3, and the processes S34 to S36 of correcting the frequency drift of the VCO 16 are performed again after the phase correction. These processes are repeated until reception completion.

According to the second embodiment, the following operational effects are exhibited.

(1) The frequency lock operation is performed in a state where the loop gain of the frequency-locked loop circuit 2A in which lock is completed is switched to a small loop gain, and thus the frequency fluctuation of the VCO 16 in the frequency-locked loop circuit 2A can be corrected without oscillating a phase-locked loop undesirably even during the phase lock operation. Even in the case that an undesired frequency fluctuation is caused to occur in the VCO 16 due to a change in temperature or the like, the clock signal CLKf for input data can be synchronized without resuming the frequency lock operation using an input data pattern.

(2) The frequency-locked loop circuit 2A can simply perform switching of the loop gain of the frequency-locked loop using the variable gain circuit 13A.

(3) Since the frequency-locked loop circuit 2A performs the frequency lock operation on an arbitrary pattern of the input data Din, the configuration of the frequency-locked loop circuit 2A becomes more complicated than in the case that the frequency lock operation is performed using a fixed pattern as in the first embodiment, but it is possible to cope with the frequency drift of the VCO 16 without requiring the creation of a new loop circuit such as the drift correction circuit 4.

(4) The oscillation frequency of the VCO 16 in which lock is completed is corrected in a phase lock completion state, using the frequency-locked loop circuit 2A switched to a small loop gain, and thus the frequency drift of the VCO 16 can be corrected by previously preventing the occurrence of concern for a phase-locked loop becoming unstable.

Third Embodiment

Figure 10:
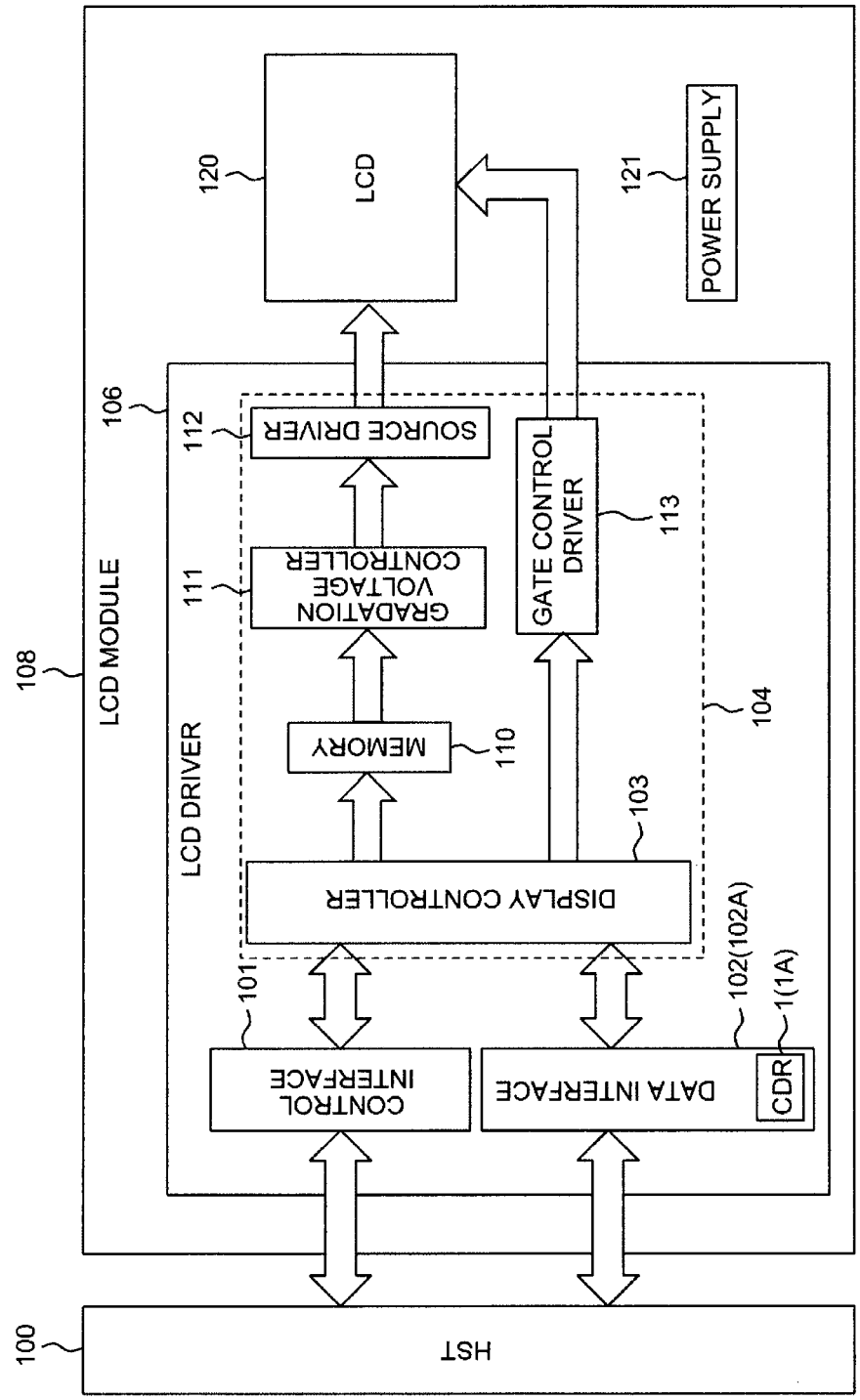
FIG. 10 is a block diagram illustrating a liquid crystal driver as a semiconductor device including a CDR circuit in an external interface circuit as a third embodiment.

FIG. 10 illustrates a liquid crystal driver as a semiconductor device including a CDR circuit in an external interface circuit as a third embodiment. A liquid crystal driver (LCD driver) 106 constitutes an LCD module (or LCD panel) 108 together with a liquid crystal display (LCD_DSP) 120 and a power supply circuit 121 which are formed in a glass substrate.

The liquid crystal driver (LCD driver) 106 includes a control interface 101 and a data interface 102 (102A) that inputs image data, as external interface circuits which are connected to the host device (HST) 100. A command is supplied from the host device 100 through the control interface circuit 101, and display data is supplied through the data interface 102 (102A). The CDR circuit 1 (1A) is applied to the data interface 102 (102A), to constitute a so-called clock embedded data interface. The processing circuit 106 that processes the command supplied to the control interface 101 and the image data supplied to the data interface 102 (102A) includes a display controller 103 as a processing controller, a memory 110, a gradation voltage controller 111, a source driver 112, and a gate control driver 113. The display controller 103 controls the inside of the circuit using decoded results of the supplied command and command parameters, and stores the supplied display data in the memory 110. The gradation voltage controller 111 generates a plurality of gradation voltages, and selects a gradation voltage in pixel units in accordance with the display data in display line units provided from the memory 110 in synchronization with a display timing, to provide selected gradation voltage to the source driver 112. In a display operation, the display controller 103 sequentially selects and drives gate lines of the liquid crystal display 120 in synchronization with a horizontal scanning period for each display frame using the gate control driver 113. In addition, the display controller 103 transfers one gate line's worth of display data (display line data) from the memory 110 to the gradation voltage controller 111 in synchronization with the horizontal scanning period, and selects a gradation voltage in pixel units of the data using the transferred display line data. The selected gradation voltage is supplied to a plurality of driving amplifiers constituting the source driver 112. The plurality of driving amplifiers drive a plurality of source lines of the liquid crystal display 120 in a parallel manner in display line data units.

The CDR circuit 1 (1A) is applied to the data interface 102 (102A), and thus it is possible to improve the reliability of a so-called clock embedded data interface in the LCD driver 106. Even in the case that a drop in oscillation frequency due to a rise in the temperature of the VCO 16 is caused, it is possible to correct the fluctuation portion through the frequency correction of the oscillation clock signal CLKf of the VCO 16. During the correction, it is not necessary to resume clock synchronization from frequency lock by stopping an input of the input data Din.

As described above, while the invention devised by the inventor has been described specifically based on the embodiments thereof, the invention is not limited to the embodiments, and it goes without saying that various changes and modifications may be made without departing from the scope of the invention.

Embodiments of the invention is not limited to an LCD driver, and can be widely applied to a semiconductor device or a system inclusive of a clock embedded interface. The configurations of the frequency-locked loop circuit and the phase-locked loop circuit can be appropriately changed without being limited to the above embodiments. The setting or switching of a loop gain is not limited to the above embodiments, and can be performed various means such as a digital filter.

What is claimed is:

1. A clock data recovery (CDR) circuit comprising:
a frequency-locked loop circuit that synchronizes a frequency of an oscillation clock signal of an oscillation circuit with a frequency of input data;
a phase-locked loop circuit that inputs the oscillation clock signal and outputs a phase-locked clock signal which is synchronized with a phase of the input data; and
a drift correction circuit that calculates a correction value on the basis of a phase difference between the input data and the phase-locked clock signal during a phase lock operation or after phase lock completion based on the phase-locked loop circuit after frequency lock based on the frequency-locked loop circuit, and is able to correct an oscillation frequency of the oscillation circuit using the correction value, with a first loop gain that is smaller than a second loop gain of the frequency-locked loop circuit.

2. The CDR circuit according to claim 1, wherein the drift correction circuit calculates a frequency correction value on the basis of a phase error detected in the phase-locked loop circuit, and adds the correction value to frequency control data of the frequency-locked loop circuit, with the first loop gain that is smaller than the second loop gain of the frequency-locked loop circuit.

3. The CDR circuit according to claim 2, wherein the frequency-locked loop circuit performs a frequency lock operation on a specific fixed pattern of input data, and
the phase-locked loop circuit performs phase lock on an arbitrary pattern of input data.

4. The CDR circuit according to claim 2, further comprising a control unit, taking charging of control, which instructs the phase-locked loop circuit to start a phase lock operation in response to a frequency lock completion notification in the frequency-locked loop circuit, instructs the drift correction circuit to calculate the frequency correction value in response to a phase lock completion notification, adds the correction value to frequency control data of the frequency-locked loop circuit, with the first loop gain that is smaller than the second loop gain of the frequency-locked loop circuit, in the case that the calculated correction value reaches a predetermined value, and instructs the phase-locked loop circuit to start a phase lock operation again.

5. A clock data recovery (CDR) circuit comprising:
a frequency-locked loop circuit that, operating with a first loop gain, synchronizes a frequency of an oscillation clock signal of an oscillation circuit with a frequency of input data; and
a phase-locked loop circuit that inputs the oscillation clock signal and outputs a phase-locked clock signal which is synchronized with a phase of the input data,
wherein the frequency-locked loop circuit performs a frequency lock operation, operating with a second loop gain that is lower than the first loop gain, concurrently with a phase lock operation of the phase-locked loop circuit after frequency lock or after completion of the phase lock operation.

6. The CDR circuit according to claim 5, wherein the frequency-locked loop circuit includes a variable gain circuit capable of switching the frequency-locked loop circuit between operating with the first gain and operating with the second gain.

7. The CDR circuit according to claim 5, wherein the frequency-locked loop circuit performs a frequency lock operation on an arbitrary pattern of input data, and
the phase-locked loop circuit performs phase synchronization on an arbitrary pattern of input data.

8. The CDR circuit according to claim 6, further comprising a control unit, performing control, which instructs the phase-locked loop circuit to start a phase lock operation in response to a frequency lock completion notification in the frequency-locked loop circuit, instructs the frequency-locked loop circuit to start a frequency lock operation by switching the frequency-locked loop circuit from operating with the first gain to operating with the second gain in response to a phase lock completion notification, and instructs the phase-locked loop circuit to start a phase lock operation again after frequency lock completion.

9. A semiconductor device comprising:
an external interface circuit; and
a processing circuit that processes data which is supplied to the external interface circuit,
wherein the external interface circuit includes a clock data recovery (CDR) circuit that inputs the data, wherein the CDR circuit comprises:
a frequency-locked loop circuit that synchronizes a frequency of an oscillation clock signal of an oscillation circuit with a frequency of input data;
a phase-locked loop circuit that inputs the oscillation clock signal and outputs a phase-locked clock signal which is synchronized with a phase of the input data; and
a drift correction circuit that calculates a correction value on the basis of a phase difference between the input data and the phase-locked clock signal during a phase lock operation or after phase lock completion based on the phase-locked loop circuit after frequency lock based on the frequency-locked loop circuit, and is able to correct an oscillation frequency of the oscillation circuit using the correction value, with a first loop gain that is smaller than a second loop gain of the frequency-locked loop circuit.

10. The semiconductor device according to claim 9, wherein the processing circuit inputs image data which is supplied to the CDR circuit, and outputs a gradation voltage corresponding to the input image data in pixel units in synchronization with a display timing.

11. A clock data recovery (CDR) circuit comprising:
a synchronization circuit in which a frequency-locked loop that synchronizes a frequency of an oscillation clock signal of an oscillation circuit with a frequency of input data and a phase-locked loop that inputs the oscillation clock signal and generates a phase-locked clock signal which is synchronized with a phase of the input data are formed,
wherein the synchronization circuit includes a circuit that updates a locked oscillation frequency with respect to a frequency-locked frequency based on the frequency-locked loop circuit, with a first loop gain that is smaller than a second loop gain of the frequency-locked loop, during a phase lock operation based on a phase-locked loop or after phase lock completion.

12. The CDR circuit according to claim 11, wherein the update circuit is a drift correction circuit that calculates a correction value on the basis of a phase difference between the input data and the phase-locked clock signal during phase lock operation or after phase lock completion based on the phase-locked loop after frequency lock of the frequency-locked loop, and is able to correct a fluctuation in an oscillation frequency of the oscillation circuit using the correction value, with the first loop gain that is smaller than the second loop gain of the frequency-locked loop.

13. The CDR circuit according to claim 12, further comprising a control unit, taking charging of control, which instructs the phase-locked loop circuit to start a phase lock operation in response to a frequency lock completion notification in the frequency-locked loop circuit, instructs the drift correction circuit to calculate the frequency correction value in response to a phase lock completion notification, adds the frequency correction value to frequency control data of the frequency-locked loop circuit by dropping a loop gain in the case that the calculated frequency correction value reaches a predetermined value, and instructs the phase-locked loop circuit to start a phase lock operation again.

14. The CDR circuit according to claim 11, wherein the update circuit is a variable gain circuit, disposed in the frequency-locked loop circuit, which is capable of variably switching loop gain of the frequency-locked loop circuit, and
the variable gain circuit reduces the loop gain of the frequency-locked loop circuit concurrently with a phase lock operation of the phase-locked loop circuit after frequency lock or after completion of the phase lock operation.

15. The CDR circuit according to claim 14, further comprising a control unit, performing control, which instructs the phase-locked loop circuit to start a phase lock operation in response to a frequency lock completion notification in the frequency-locked loop circuit, instructs the frequency-locked loop circuit to start a frequency lock operation by reducing the loop gain of the frequency-locked loop circuit in response to a phase lock completion notification, and instructs the phase-locked loop circuit to start a phase lock operation again after frequency lock completion.

* * * * *